US006265258B1

(12) United States Patent
Liang et al.

(10) Patent No.: US 6,265,258 B1
(45) Date of Patent: Jul. 24, 2001

(54) METHOD FOR MAKING A COMPLEMENTARY METAL GATE ELECTRODE TECHNOLOGY

(75) Inventors: Chunlin Liang; Gang Bai, both of San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/563,128

(22) Filed: May 2, 2000

Related U.S. Application Data (63) Continuation of application No. 09/107,604, filed on Jun. 30, 1998, now Pat. No. 6,130,123.

(51) Int. Cl.$^7$ .............................................. H01L 21/8249
(52) U.S. Cl. .......................................................... 438/217
(58) Field of Search .................... 438/217, 197–199, 438/218, 652, 647, 655; 148/DIG. 1

(56) References Cited

U.S. PATENT DOCUMENTS

| 3,936,860 | 2/1976 | Hill . |
| 4,555,842 | 12/1985 | Levinstein et al. . |
| 5,559,351 | 9/1996 | Takiyama . |
| 5,705,411 | 1/1998 | Yamanobe et al. . |
| 5,719,083 | * 2/1998 | Komatsu ........................ 438/652 |
| 5,796,166 | 8/1998 | Agnello et al. . |
| 5,834,353 | 11/1998 | Wu . |
| 5,912,509 | 6/1999 | Kasai et al. . |
| 5,945,821 | 8/1999 | Sakurai et al. . |
| 5,973,363 | 10/1999 | Staab et al. . |

FOREIGN PATENT DOCUMENTS

| 52-014383 | 2/1977 | (JP) . |
| 57-114281 | 7/1982 | (JP) . |
| 60-045053 | 3/1985 | (JP) . |
| 62-126671 | 6/1987 | (JP) . |
| 62-245658 | 10/1987 | (JP) . |
| 3-227562 | 10/1991 | (JP) . |

\* cited by examiner

*Primary Examiner*—Charles Bowers
*Assistant Examiner*—Craig Thompson
(74) *Attorney, Agent, or Firm*—Blakely, Sokoloff, Taylor & Zafman LLP (57) ABSTRACT

A method for making a circuit device that includes a first transistor having a first metal gate electrode overlying a first gate dielectric on a first area of a semiconductor substrate. The first gate electrode has a work function corresponding to the work function of one of P-type silicon and N-type silicon. The circuit device also includes a second transistor coupled to the first transistor. The second transistor has a second metal gate electrode over a second gate dielectric on a second area of the semiconductor substrate. The second gate metal gate electrode has a work function corresponding to the work function of the other one of P-type silicon and N-type silicon.

8 Claims, 5 Drawing Sheets

METHOD FOR MAKING A COMPLEMENTARY METAL GATE ELECTRODE TECHNOLOGY

This Application is continuation of Ser. No. 09/107,604 Jun. 30, 1998 U.S. Pat. No. 6,130,123

BACKGROUND OF THE INVENTION

1. Field of the Invention

In the context of insulated gate field effect transistors, the invention relates generally to the field of integrated circuit devices and more particularly to the structure of integrated circuit devices.

2. Background Information

The use of metal gate technology is viewed as very desirable for complementary metal oxide semiconductor (CMOS) device technology scaling below the sub 0.1 micron regime. Replacing traditional polysilicon gate electrodes with metal or metal alloy gate electrodes may reduce undesired voltage drops associated with polysilicon gate electrodes (e.g., polysilicon depletion effect) and improve device drive current performance. Metal and metal alloy gate electrodes may also reduce the parasitic resistance of the gate line and allow longer gate runners in high performance integrated circuit design for applications such as stacked gates, wordlines, buffer drivers, etc. Longer gate electrodes correspond to field effect transistors of greater width.

Conductive materials have different energies measured conventionally by their Fermi level. As an example, the Fermi level of a material determines its work function. The intrinsic Fermi level of an undoped semiconductor is at the middle of the bandgap between the conduction and valence band edges. In an N-type doped silicon, the Fermi level is closer to the conduction band than to the valence band (e.g., about 4.15 electron-volts). In a P-type doped silicon, the Fermi level is closer to the valence band than the conduction band (e.g., about 5.2 electron-volts).

Metals or their compounds have been identified that have work functions similar to the work functions of a conventional P-type doped semiconductor substrate. Other metals or their compounds have been identified that have work functions similar to a conventional N-type doped semiconductor substrate. Examples of metals that have a work function similar to P-type doped semiconductor material, include but are not limited to, nickel (Ni), ruthenium oxide (RuO), molybdenum nitride (MoN), tantalum nitride (TaN), molybdenum silicide ($MoSi_2$), and tantalum silicide ($TaSi_2$). Examples of metals that have a work function to N-type doped semiconductor material, include but are not limited to, ruthenium (Ru), zirconium (Zr), niobium (Nb), and tantalum (Ta).

Previously proposed metal gate CMOS technology has focused on using one type of metal having a Fermi level located in the middle of the conduction and valence band of the silicon substrate (e.g., work function of about 4.7 electron-volts). One drawback of mid-bandgap metals, however, is their inability to achieve the small threshold voltage ($V_T$) desirable for future CMOS technology scaling, without degrading short channel effects.

A complementary metal gate approach with two work functions, optimized for both NMOS and PMOS devices, respectively, thus far has yet to be integrated into a workable process. The simple method to deposit complementary metals, one after the other, would damage the thin gate dielectric during patterning of at least one of the electrodes making the transistor unusable.

What is needed is the incorporation of complementary metal gate electrode technology into a workable process that is scalable for future CMOS technologies.

SUMMARY OF THE INVENTION

A device is disclosed. The device includes a first transistor having a first metal gate electrode overlying a first gate dielectric on a first area of a semiconductor substrate. The first gate electrode has a work function corresponding to the work function of one of P-type silicon and N-type silicon. The device also includes a second transistor complementary to the first transistor. The second transistor has a second metal gate electrode over a second gate dielectric on a second area of the semiconductor substrate. The second metal gate electrode has a work function corresponding to the work function of the other one of P-type silicon and N-type silicon.

DETAILED DESCRIPTION OF THE INVENTION

A circuit device employing metal gate electrodes tuned for a work function similar to the desired device type is disclosed. The invention is particularly useful for, but not limited to, the utilization of metal gate electrodes in CMOS technology tuned for optimum NMOS and PMOS device performance. The invention offers a workable process for providing integrated complementary metal gate electrode technology that is scalable for future CMOS technologies.

The invention describes metal gate electrodes or their compounds having Fermi levels close to either N-type or P-type doped silicon. It is to be appreciated that the suitable metal may exist at the desired Fermi level in its natural state or by chemical reaction, alloying, doping, etc. One aspect of the invention described herein is directed at workable methods of modifying metals for optimum NMOS and PMOS device performance.

Figure 1:
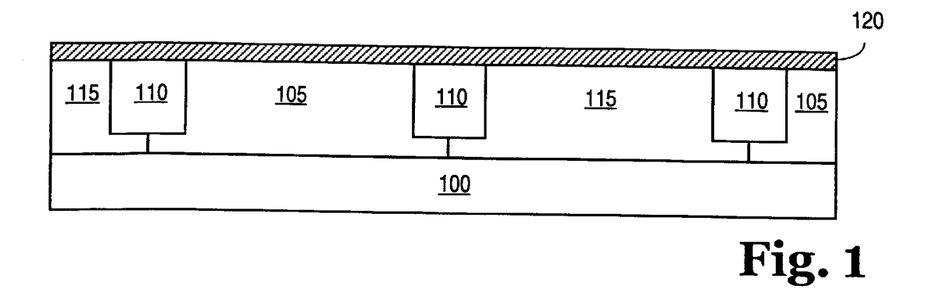
FIG. 1 is a schematic side view illustration of a portion of a semiconductor substrate after the processing step of forming shallow trench isolation structures and well regions in the substrate and a gate dielectric over the surface of a substrate in accordance with a first embodiment of the invention.

FIGS. 1–7 illustrate an embodiment of a method of forming a PMOS and NMOS devices structure utilizing the complementary gate electrode technology of the invention. FIG. 1 shows semiconductor substrate 100, such as a silicon substrate, or epitaxial layer 100 of a semiconductor substrate having active areas or cell regions defined by shallow trench isolation structures 110 formed in substrate or epitaxial layer 100. In this embodiment, shallow trench isolation structures 110 define active areas or cell regions for individual transistor devices.

FIG. 1 also shows the formation of wells 105 and 115 in the individual active area or cell region defined by shallow trench isolation structures 110. For example, P-type well 105 is formed in one region of substrate 100 while N-type well 115 is formed in a second region of substrate 100. P-type well 105 is formed by introducing a dopant, such as boron, into the substrate. N-type well 115 is formed by introducing a dopant, such as arsenic, phosphorous, or antimony into substrate 100. The practices of forming shallow trench isolation structures 110 and wells 105 and 115 are known in the art and are therefore not presented herein.

FIG. 1 still also shows substrate 100 after the further processing step of forming a gate dielectric over the surface of substrate 100. Gate dielectric 120 may be grown or deposited. An example of gate dielectric material that is typically grown by thermal techniques over substrate 100 is silicon dioxide ($SiO_2$). It is to be appreciated that, in addition to $SiO_2$, other gate dielectrics may be used to further optimize the CMOS transistor devices. For example, gate dielectric materials having a high dielectric constant may be utilized if desirous, for example, to increase the capacitance of the gate.

Figure 2:
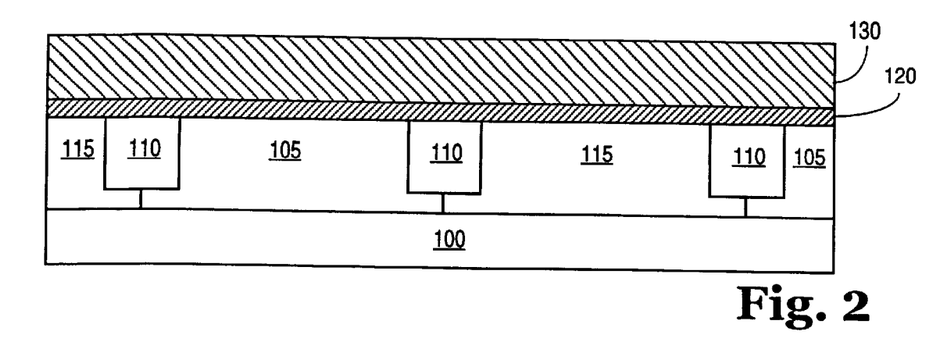
FIG. 2 shows the semiconductor substrate of FIG. 1 after the further processing step of depositing a metal layer over the gate dielectric in accordance with the first embodiment of the invention.

After gate dielectric 120 is formed, FIG. 2 shows the substrate of FIG. 1 after the further processing step of depositing metal layer 130 over the surface of substrate 100. In this embodiment, metal layer 130 is deposited to thickness a of, for example, 500–2000 Å. In the embodiments that are described herein, the physical properties of at least a portion of metal layer 130 will be modified to adjust the work function for optimum NMOS and PMOS device performance. Thus, metal layer 130 will serve in its present state or in a modified state as a gate electrode. Accordingly, the thickness of metal layer 130 is scalable and should be chosen based primarily on integration issues related to device performance. Further, since in many of the embodiments that are described herein, the physical properties of metal layer 130 will be modified, care should be taken to avoid making metal layer 132 too thick so that, when desired, any modification or transformation of metal layer 130 is complete.

Figure 3:
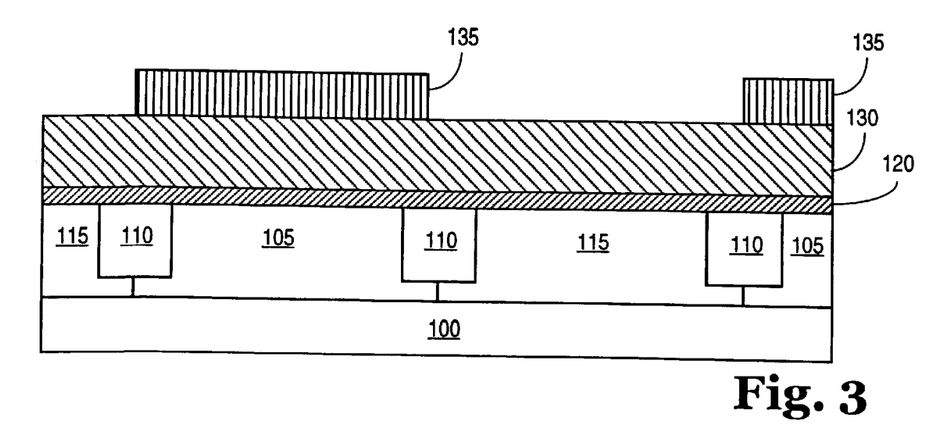
FIG. 3 shows the semiconductor substrate of FIG. 1 after the further processing step of masking a portion of the metal layer over a region of the substrate in accordance with the first embodiment of the invention.

FIG. 3 shows the substrate of FIG. 1 after the further processing step of patterning mask layer 135 over a portion of metal layer 130. In this embodiment, mask layer 135 is patterned over the active area or cell region represented by P-type well 105. Thus, the portion of metal layer 130 over active area or cell region denoted by N-type well 115 is exposed.

In one embodiment, mask layer 135 is an inactive hard mask material. Mask layer 135 material is inactive inasmuch as it will not participate in a chemical reaction with metal layer 130. Suitable inactive mask materials for mask layer 135 include, but are not limited to, $SiO_2$ and silicon nitride ($Si_3N_4$).

In one embodiment, metal layer 130 is tantalum (Ta). One analysis of the work function of tantalum identifies its Fermi level as between 4.15 and 4.25 electron-volts. Thus, tantalum itself may act as a suitable gate electrode material for an N-type device. Accordingly, in this example, -metal layer 130 is protected by mask layer 135 over active areas or cell regions denoted by P-type well 105, e.g., active areas or cell regions that may accommodate an N-type device. In this example, mask layer 135 is an inactive hard mask such as $SiO_2$ or $Si_3N_4$.

Figure 4:
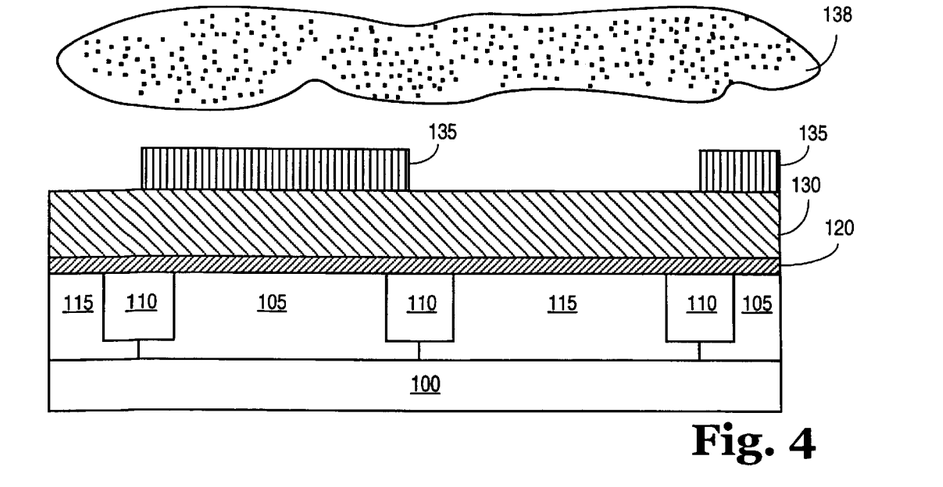
FIG. 4 shows the semiconductor substrate of FIG. 1 during the processing step of exposing the unprotected portion of the metal layer to a chemically reactive ambient in accordance with the first embodiment of the invention.

As shown in FIG. 4, substrate 100 is then exposed to an ambient such as ammonia ($NH_3$) or nitrogen ($N_2$). The reactive ambient interacts with the exposed areas of metal layer 130 overlying N-type well 115. In the case of a tantalum metal layer, the interaction and reaction between tantalum and $NH_3$ or $N_2$ produces a metal layer of tantalum nitride (TaN) over N-type well 115. A TaN metal layer has a reported work function of 5.41 electron volts, suitable for use as a P-type gate electrode.

In another embodiment, mask layer 135 may be made of an active material. In this manner, mask layer 135 may inhibit the reaction by a subsequent processing step (e.g., serve as a mask to a subsequent processing step) while itself reacting with metal layer 130 over the active areas or cell regions denoted by P-type well 105. A suitable active mask includes, but is not limited to, undoped polysilicon. Polysilicon may react with metal layer 130 to form a silicide. In an example of an active mask of polysilicon, metal layer 130 is, for example, molybdenum (Mo). The exposed area of metal layer 130 is exposed to an $NH_3$ or $N_2$ ambient as shown in FIG. 4. The unprotected molybdenum reacts with the ambient to form molybdenum nitride (MoN) that has a reported Fermi level of 5.33 electron-volts (P-type). At the same time, through the addition of heat, such as for example, 850° C., polysilicon mask layer 135 reacts with the molybdenum over active areas or cell regions denoted by P-type well 105 to form molybdenum silicide. Molybdenum silicide has a reported Fermi level of 4.25 electron-volts (N-type).

Figure 5:
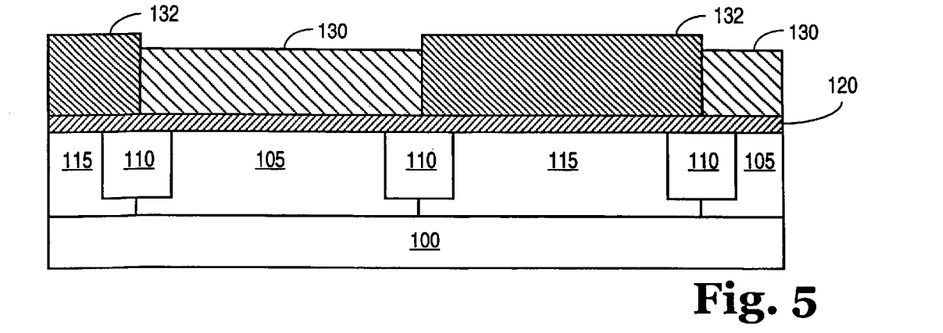
FIG. 5 shows the substrate of FIG. 1 after the further processing step of reacting the exposed metal layer with the chemically reactive ambient and removing the masking layer in accordance with the first embodiment of the invention.

FIG. 5 shows substrate 100 after the further processing step of removing inactive mask 135 from the area above metal layer 130 over the active area or cell region denoted by P-type well 105. Alternatively, FIG. 5 shows substrate 100 after the further processing step of reacting the exposed portion of metal layer 130 with reactive ambient 138 and the protected portion of metal layer 130 with active mask 135. Accordingly, in either embodiment, FIG. 5 shows a metal layer overlying substrate 100 having tuned work functions for the particular electrode device that will be used in the respective active area or cell region. For example, FIG. 5 shows a portion of metal layer 130, such as for example tantalum,. overlying the active area or cell region denoted by P-type well 105. Metal layer 130, such as for example tantalum, has a work function corresponding to the work function of an N-type device, identifying the availability of a metal gate electrode with a tuned work function for an NMOS device in connection with P-type well 105. Conversely, FIG. 5 shows metal layer 132 over an active area or cell region denoted by N-type well 115. Metal layer 132 was formed by the reaction of metal layer 130 with reactive ambient 138 as described above. Metal layer 132 is, for example, tantalum nitride (TaN) having a Fermi level of 5.41 electron-volts. Thus, metal layer 132 is tuned or optimized for a gate electrode of a PMOS device associated with N-type well 115.

Figure 6:
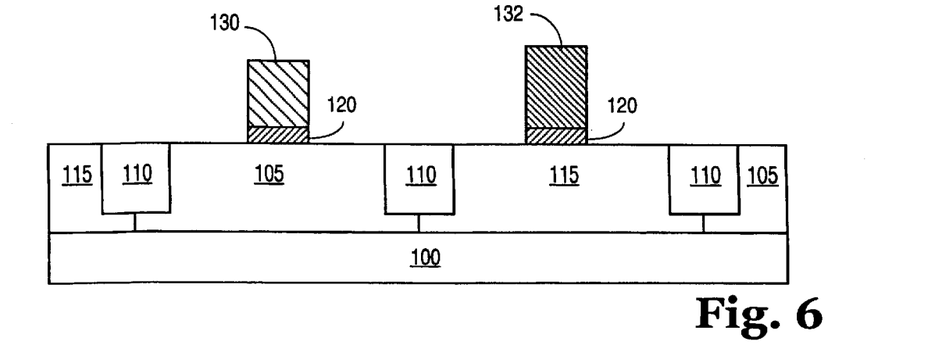
FIG. 6 shows the substrate of FIG. 1 after the further processing step of patterning complementary gate electrodes in adjacent cell regions in accordance with the first embodiment of the invention.

FIG. 6 shows substrate 100 after the further processing step of patterning the individual metal layers 130 and 132 over their respective device regions. As shown in FIG. 6, N-type metal layer 130 is formed into metal gate electrode 130 over the region of substrate 100 occupied by P-type well 105. P-type metal layer 132 is patterned into P-type gate electrode 132 over an area of substrate 100 occupied by N-type well 115. Metal layers 130 and 132 are patterned using conventional techniques such as a plasma etchant. In the case of tantalum and TaN, for example, a suitable etchant is a chlorine-based etch chemistry. Patterned in accordance with electrodes 130 and 132 is gate dielectric 120.

Figure 7:
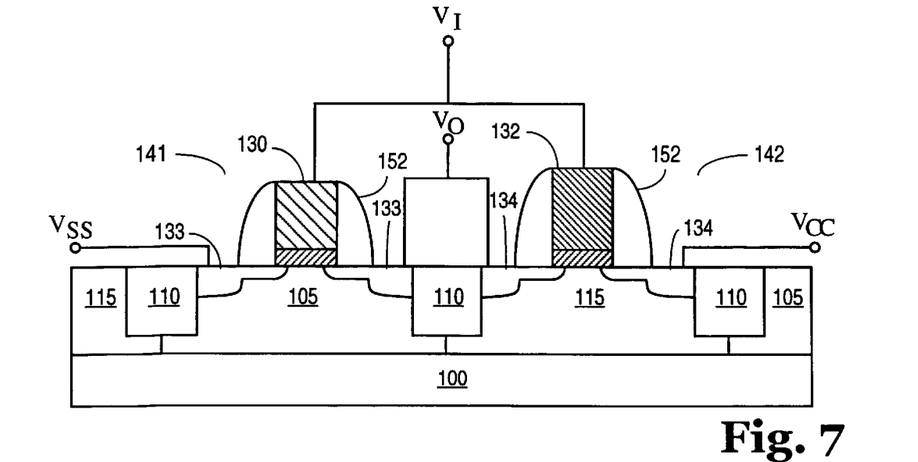
FIG. 7 shows the substrate of FIG. 1 after the further processing step of patterning complementary transistors in adjacent cell regions in accordance with the first embodiment of the invention.

FIG. 7 shows substrate 100 after the further processing step of forming diffusion or junction regions in substrate 100 in accordance with the characteristics of the desired device. With respect to the N-type device identified by N-type gate electrode 130 overlying P-type well 105, N-type diffusion or junction regions 133 are formed in P-type well 105 in accordance with conventional techniques. For example, N-type diffusion or junction regions 133 may be formed adjacent gate electrode 130 and self-aligned to gate electrode 130 by implanting a suitable dopant such as, for example, arsenic, phosphorous, or antimony, into P-type well 105. Similar processing steps may be used to form P-type regions 134, using a dopant, such as, for example, boron. Once diffusion or junctions regions 133 and 134 are formed, gate isolation spacers 152 of a suitable dielectric may be incorporated around gate electrode 130 and gate electrode 132. Further dopants may then be added to the diffusion or junction regions as desired.

The process described above with respect to FIGS. 1–7 illustrates the process of utilizing metal gate electrodes in CMOS technology tuned for improved NMOS and PMOS performance. To make a CMOS structure, the NMOS and PMOS devices described above are coupled in an appropriate manner. FIG. 7 illustrates the coupling of NMOS device 141 and PMOS device 142 for an inverter.

Figure 8:
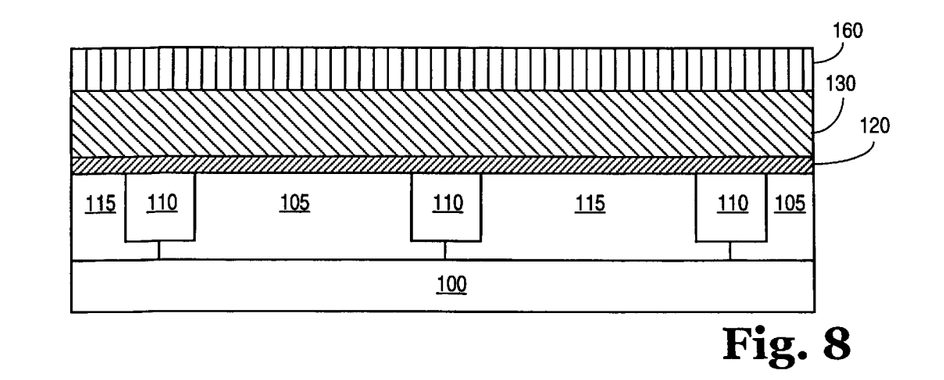
FIG. 8 shows a schematic side view illustration of the semiconductor substrate of FIG. 1 after the processing steps of forming cell regions with desired dopants in the substrate and forming a gate dielectric, a first metal layer, and a second layer of metal or other material over the top surface of the substrate in accordance with a second embodiment of the invention.

FIGS. 8–11 illustrate a second process of forming complementary gate electrodes for optimum NMOS and PMOS device performance. In this process, as shown in FIG. 8, semiconductor substrate or epitaxial layer 100 of a substrate has P-type well 105 and N-type well 115 formed in substrate or epitaxial layer 100 defining active area or cell region by shallow trench isolation structures 110. Overlying substrate 100 is gate dielectric 120 as described above and metal layer 130 deposited to a scalable thickness of, for example, approximately 500–2000 Å. In one embodiment, metal layer 130 is chosen to have an appropriate work function for one of an NMOS gate electrode and a PMOS gate electrode (e.g., Fermi level of about 4.1 electrons-volts or 5.2 electron-volts, respectively). Alternatively, metal layer 130 may employ subsequent modification to tune the material to an appropriate work function for an NMOS device. Deposited over metal layer 130 in FIG. 8 is second metal or other material layer 160.

Figure 9:
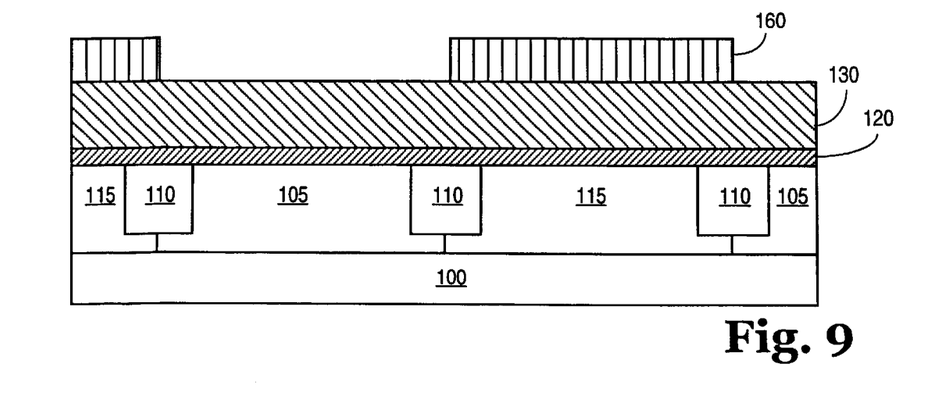
FIG. 9 shows the substrate of FIG. 7 after the further processing step of patterning the second layer over one active region of the first metal layer in accordance with the second embodiment of the invention.

FIG. 9 shows the structure after the further processing step of patterning second metal or other material layer 160 over a portion of metal layer 130. In this case, second metal or other material layer 160 is patterned over the active area or cell region denoted by N-type well 115. Metal layer 130 overlying P-type well 105 is left exposed.

Figure 10:
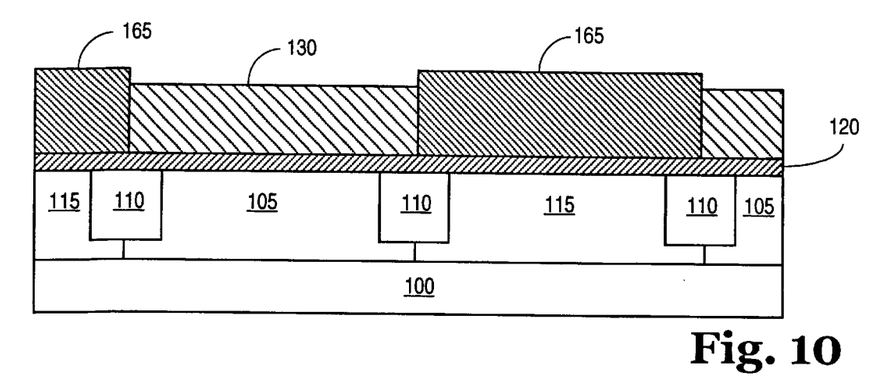
FIG. 10 shows the substrate of FIG. 7 after the further processing step of reacting the second layer with the first metal layer in accordance with the second embodiment of the invention.

Next, the structure is exposed to a heat treatment, such as for example, a high temperature (e.g., 900–1000° C.) or laser anneal, to drive the reaction or combination of second metal or other material layer 160 and metal layer 130 to form a metal alloy or other compound. FIG. 10 shows substrate 100 after the further processing step of subjecting metal layer 130 to a heat treatment and forming a metal alloy or other metal compound over N-type well 115. The metal alloy or metal compound 165 is selected to have an appropriate work function for a PMOS device. Examples of suitable metal alloys or metal compounds formed in the manner described include, but are not limited to, molybdenum silicide.

Figure 11:
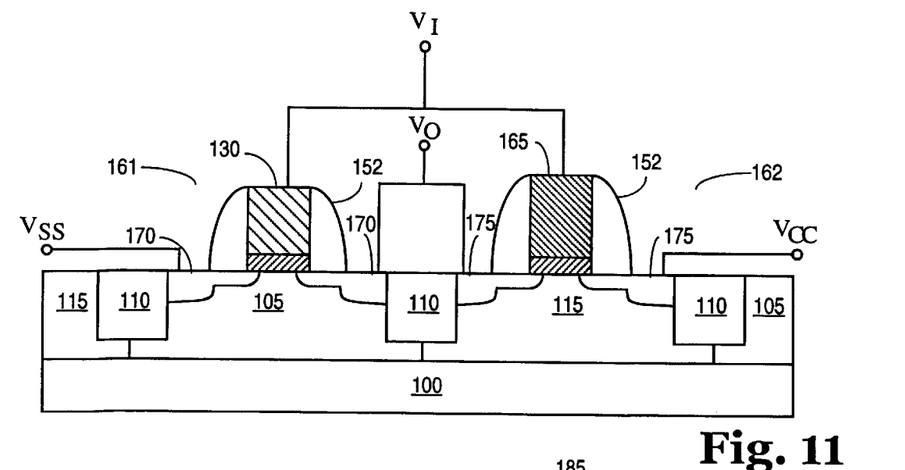
FIG. 11 shows the substrate of FIG. 7 after the processing step of forming complementary transistor devices in adjacent cell regions in accordance with the second embodiment of the invention.

FIG. 11 shows substrate 100 after the further processing step of patterning metal layers 130 and 165 into metal gate electrodes and forming NMOS transistor device 161 and PMOS transistor device 162 by a process such as described above with reference to FIGS. 6 and 7. NMOS transistor device 161 includes doped diffusion or junction regions 170 and PMOS transistor device 162 includes doped diffusion or junction regions 175. Finally, as an example, FIG. 11 illustrates the coupling of NMOS transistor device 161 and PMOS transistor device 162 for an inverter.

In the process described, second metal layer 160 is described as a material that interacts or reacts with metal layer 130 and forms an alloy of metal compound with a desired work function. It is to be appreciated that second metal layer 130 could also be polysilicon. In this manner, the reaction between metal layer 130 and polysilicon layer 160 may be a silicide reaction to form a metal silicide having an appropriate work function. It is also to be appreciated that the process may be reversed. In other words, metal layer 130 could be patterned as a polysilicon layer with second metal or other material layer 160 being an appropriate metal to form a metal silicide in accordance with the invention. One approach where the latter process might be preferred is the situation, for example, where only the NMOS transistor devices of the CMOS circuit utilizes a metal gate electrode with an optimized work function (i.e., Fermi level of approximately 4.5 electron-volts). Since, in many CMOS circuits, the performance of the NMOS device is more important than the performance of the PMOS device, the process described herein offers a workable method of improving NMOS device performance while leaving PMOS device performance relatively unchanged. Alternatively, two different metals can be deposited and patterned on the polysilicon layer to form two complementary suicides for the NMOS device and the PMOS device, respectively.

Figure 12:
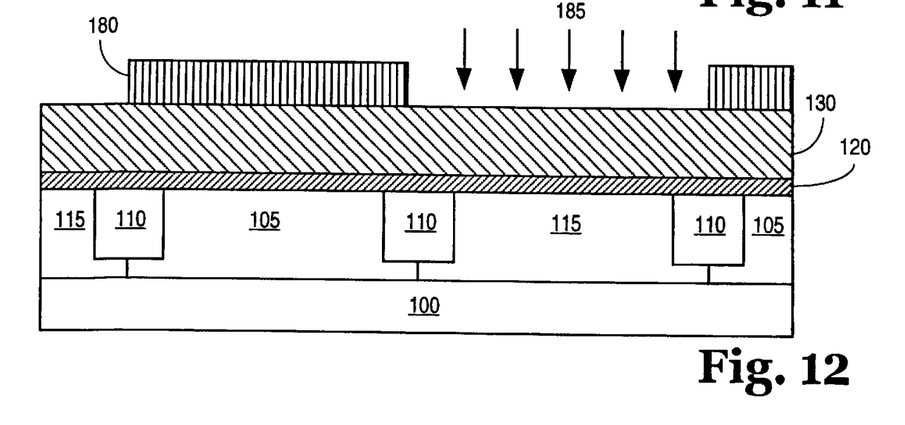
FIG. 12 shows a schematic side view illustration of a semiconductor substrate after the processing steps of forming complementary doped cell regions in the substrate and a gate dielectric material, a first metal layer, and a patterned mask over the substrate and shows the processing step of subjecting the unmasked portion of the metal layer to ion implantation in accordance with a third embodiment of the invention.
Figure 13:
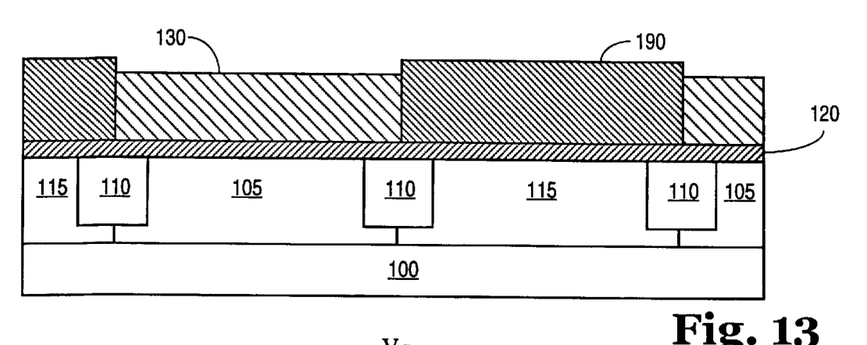
FIG. 13 shows the substrate of FIG. 12 after the processing step of ion implantation and removal of the mask in accordance with the third embodiment of the invention.
Figure 14:
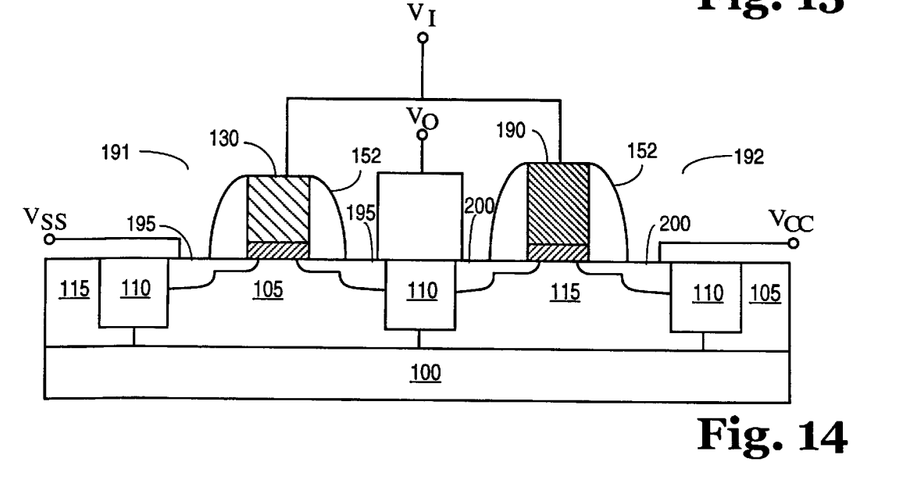
FIG. 14 shows the substrate of FIG. 12 after the processing step of patterning complementary transistor devices in adjacent cell regions in accordance with the third embodiment of the invention.

FIGS. 12–14 shows a third process of tuning the metal gate electrode to improve NMOS and PMOS device performance by a process generally described as ion mixing. FIG. 12 again shows substrate 100 having P-type well 105 and N-type well 115 formed in substrate 100 or as part of active areas or cell regions defined by shallow trench isolation structures 110.

Overlying substrate 100 is gate dielectric 120. Overlying gate dielectric 120 is metal layer 130.

FIG. 12 shows substrate 100 after the further processing step of adding masking layer 180, such as for example, a hard inactive mask of $SiO_2$ or $Si_3N_4$ over that portion of substrate 100 denoted by P-type well 105. In one embodiment, metal layer 130 is chosen, for example, to have a work function corresponding to that of N-type doped silicon (e.g., Fermi level of about 4.1 electron-volts). In this manner, metal layer 130 may be patterned over the active area or cell region associated with P-type well 105 to form an NMOS device with a gate electrode tuned for optimum device performance. Alternatively, masking layer 180 may be an active mask, such as for example, a polysilicon, that may react with metal layer 130 in the presence of heat to form a metal silicide having a work function corresponding to the work function of N-type doped silicon.

FIG. 12 shows the further processing step of subjecting the exposed portion of metal layer 130 to an ion implantation 185. The ion implantation step seeks to implant a dosage of ions into the exposed portion of metal layer 130 to modify the work function of metal layer 130. In the embodiment presented, for example, ions are implanted and the implanted metal is annealed (by heat or laser) to modify the work function of metal layer 130 material into a P-type work function metal layer material. FIG. 13 shows substrate 100 after the further processing step of implanting a sufficient dosage of ion to modify the work function of metal layer 130 over active area or cell region denoted by N-type well 115. The modified metal is represented by P-type metal layer 190.

FIG. 14 shows substrate 100 after the further processing step of forming NMOS transistor device 191 and PMOS device 192 utilizing tuned metal gate electrode 130 and 190 over an active area or cell region denoted by P-type well 105 and N-type well 115, respectively. NMOS transistor device 191 includes metal gate electrode 130 having a work function corresponding approximately to the work function of the N-type doped silicon, with N-type doped diffusion or junction region 495. Similarly, PROS device 192 has metal gate electrode 190 having a work function corresponding approximately to the work function of P-type doped silicon with P-type doped silicon diffusion or junction region 200 formed in substrate. Finally, FIG. 14, as an example, illustrates the coupling of NMOS transistor device 191 and PMOS transistor device 192 for an inverter.

The above discussion presented various ways of turning metal gate electrode for improved NMOS and PMOS device performance. The invention is particularly useful for, but are not limited to, the utilization of metal gate electrode in CMOS technology. The above discussion assumed that the gate electrode patterning is done after the modification of the metal layer. It is to be appreciated that the same modification of metal material may be accomplished by patterning the gate electrode first and modifying the gate electrode properties afterwards. Whichever sequence is better depends on how the process is integrated into the entire fabrication process.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:

introducing a metal layer over an area of substrate;

modifying the work function of the metal layer over a portion of the area; and patterning the metal layer into a first gate electrode and a second gate electrode of complementary transistor devices.

2. The method of claim 1, wherein the modifying the work function of the metal layer comprises modifying over less than the entire portion of the area.

3. The method of claim 1, wherein modifying the work function comprises exposing the metal layer to a reactive ambient 4. The method of claim 3, wherein modifying the work function comprises protecting a portion of the metal layer from the reactive ambient.

5. The method of claim 1, wherein the metal layer is a first layer and modifying the work function comprises:

introducing a second material layer over the first layer; and interacting the second layer with the first layer.

6. The method of claim 5, wherein interacting comprises forming an alloy.

7. The method of claim 5, wherein the second layer comprises a silicon material and interacting comprises forming a silicide.

8. The method of claim 1, wherein modifying the work function comprises implanting ions into the metal layer.

* * * * *

UNITED STATES PATENT AND TRADEMARK OFFICE
CERTIFICATE OF CORRECTION

PATENT NO. : 6,265,258 B1
DATED : July 24, 2001
INVENTOR(S) : Liang et al.

It is certified that error appears in the above-identified patent and that said Letters Patent is hereby corrected as shown below:

Column 2,
Line 3, delete " the incorporation of", insert -- a method for utilizing --.
Line 4, delete "into a workable process that is scalable for future CMOS technologies.", insert -- in CMOS circuits. --.

Column 7,
Line 8, delete "suicides", insert -- silicides --.
Line 56, delete "PROS", insert -- PMOS --.

Signed and Sealed this

Fourth Day of June, 2002

*Attest:*

JAMES E. ROGAN
*Attesting Officer*     *Director of the United States Patent and Trademark Office*